United States Patent [19]

Nemoto

[11] Patent Number: 4,672,238

[45] Date of Patent: Jun. 9, 1987

[54] SIGNAL DETECTING CIRCUIT

[75] Inventor: Masahisa Nemoto, Tokyo, Japan

[73] Assignee: NEC Corporation, Tokyo, Japan

[21] Appl. No.: 817,201

[22] Filed: Jan. 8, 1986

[30] Foreign Application Priority Data

Jan. 8, 1985 [JP] Japan .................................. 60-1167

[51] Int. Cl.[4] ........................................... H03K 5/153
[52] U.S. Cl. .................. 307/350; 307/354; 307/358
[58] Field of Search ................ 307/350, 351, 354, 358

[56] References Cited

U.S. PATENT DOCUMENTS 3,700,920  12/1972  Eyler ..................................... 307/351
4,020,423  4/1977   Guyot et al. ......................... 307/351

*Primary Examiner*—John Zazworsky
*Attorney, Agent, or Firm*—Sughrue, Mion, Zinn, Macpeak and Seas

[57] ABSTRACT

A signal detecting circuit includes a first source follower having an input connected to a first voltage source, and a second source follower having an input connected to a second voltage source. There is provided an additional field effect transistor having a gate connected to the input of the second source follower, a source which is connected through a resistor to an output of the first source follower. The source of the additional field effect transistor is connected to a signal input terminal and one input of a voltage comparator whose other input is connected to an output of the second source follower.

20 Claims, 10 Drawing Figures

SMALL SIGNAL

LARGE SIGNAL

SMALL SIGNAL

LARGE SIGNAL

SIGNAL DETECTING CIRCUIT

BACKGROUND OF THE INVENTION

1. Field of the Invention

The present invention relates to a circuit for detecting a signal component of a periodic signal which includes a relatively large noise component.

2. Description of Related Art

Heretofore, this type of signal detecting circuit has typically been composed of a peak hold circuit receiving an input signal, and a voltage comparator having two inputs, one of which receives the input signal and the other of which is connected to the output of the peak hold circuit.

However, the peak hold circuit ordinarily requires a charge storing capacitor which must be of substantial capacitance to hold the potential, and which therefore is very difficult to provide in integrated circuit form. Accordingly, when the above type of signal detecting circuit is constructed in the form of an integrated circuit, the charge storing capacitor is externally connected to the integrated circuit, and so, the signal detecting integrated circuit has to have not only signal input and output terminals but also an external terminal for connection of the charge storing capacitor.

Furthermore, in the case of no signal, the output signal level of the peak hold circuit becomes substantially the same as that at the signal input terminal. In other words, the two inputs of the voltage comparator become substantially equal. On the other hand, since noises themselves vary in amplitude or level, in a no signal condition, noises will often erroneously be detected as signal components by the comparator.

In addition, the voltage comparator will properly operate when the input signals applied to the comparator are within the common-mode input voltage range. However, in the above signal detecting circuit, since the reference input voltage of the voltage comparator follows the peak level of the input signal, the amplitude of the input signal must be limited to be within the common-mode input voltage range for proper operation, and therefore, the circuit will often malfunction when too large of a signal is applied.

SUMMARY OF THE INVENTION

Accordingly, it is one object of the present invention to provide an improved signal detecting circuit which overcomes the aforementioned drawbacks of the conventional circuit.

Another object of the present invention is to provide a signal detecting circuit which needs no charge storing capacitor, and which can be assembled in integrated circuit form without an additional terminal.

Still another object of the present invention is to provide a signal detecting circuit which will stably and properly operate in a no-signal or small-signal condition.

A further object of the present invention is to provide a signal detecting circuit which will not malfunction even if too large of a signal is applied.

The above and other objects of the present invention are achieved in accordance with the present invention by a signal detecting circuit comprising a first source follower having an input connected to a first voltage source, a second source follower having an input connected to a second voltage source, an additional field effect transistor having a gate connected to the input of the second source follower and a source connected through a resistor to an output of the first source follower, a signal input terminal connected to the source of the additional field effect transistor, and a voltage comparator having two inputs, one of which is connected to the source of the additional field effect transistor and the other of which is connected to an output of the second source follower.

Preferably, the signal input terminal is connected through a capacitor to the source of the additional field effect transitor.

In one embodiment of the present invention, the first source follower includes a first drain-grounded p-channel insulated gate field effect transistor having a gate connected to the first voltage source and a source connected to the resistor and also connected through a constant current source to a positive supply voltage. The scond source follower includes a second drain-grounded p-channel insulated gate field effect transistor having a gate connected to the second voltage source and a source connected to the other input of the voltage comparator and also connected through another constant current source to the positive supply voltage. The additional field effect transistor is a third p-channel insulated gate field effect transistor having a gate connected to the gate of the second p-channel field effect transistor and a drain connected to ground. In this case, preferably, the voltage of the first voltage source is smaller than that of the second voltage source, and the resistance of the resistor is sufficiently larger than the conduction resistance of the additional field effect transistor.

In another embodiment of the present invention, the first source follower includes a first n-channel insulated gate field effect transistor having a gate connected to the first voltage source and a drain connected to a positive supply voltage. The source of the first field effect transistor is connected to the resistor and also grounded through a constant current source. The second source follower includes a second n-channel insulated gate field effect transistor having a gate connected to the second voltage source and a drain connected to the positive supply voltage. The source of the second n-channel field effect transistor is connected to the other input of the voltage comparator and also grounded through another constant current source. The additional field effect transistor is a third n-channel insulated gate field effect transistor having a gate connected to the gate of second n-channel field effect transistor and a drain connected to the positive supply voltage. In this case, preferably, the voltage of the first voltage source is larger than that of the second voltage source, and the resistance of the resistor is sufficiently larger than the conduction resistance of the additional field effect transistor.

Each of the first and second voltage sources can be constituted of a pair of series-connected insulated gate field effect transistors, each having a gate and a drain commonly connected to each other. More specifically, each of the first and second voltage sources includes a p-channel insulated gate field effect transistor having a source connected to the positive supply voltage and a gate and a drain commonly connected to an output terminal of the voltage source, and an n-channel source-grouned insulated gate field effect transistor having a gate and drain commonly connected to the output terminal of the voltage source.

Alternatively, each of the first and second voltage sources can include an n-channel insulated gate field effect transistor having a gate and a drain commonly connected to the positive supply voltage and a source connected to an output terminal of the voltage source, and another n-channel source-grouned insulated gate field effect transistor having a gate and drain commonly connected to the output terminal of the voltage source.

Furthermore, each of the first and second voltage sources can include a p-channel insulated gate field effect transistor having a source connected to the positive supply voltage and a gate and a drain commonly connected to an output terminal of the voltage source, and another p-channel insulated gate field effect transistor having a source connected to the output terminal of the voltage source and a gate and a drain commonly grounded.

The above and other objects, features and advantages of the present invention will be apparent from the following description of preferred embodiments of the invention with reference to the accompanying drawings.

DESCRIPTION OF THE PREFERRED EMBODIMENTS

Figure 1:
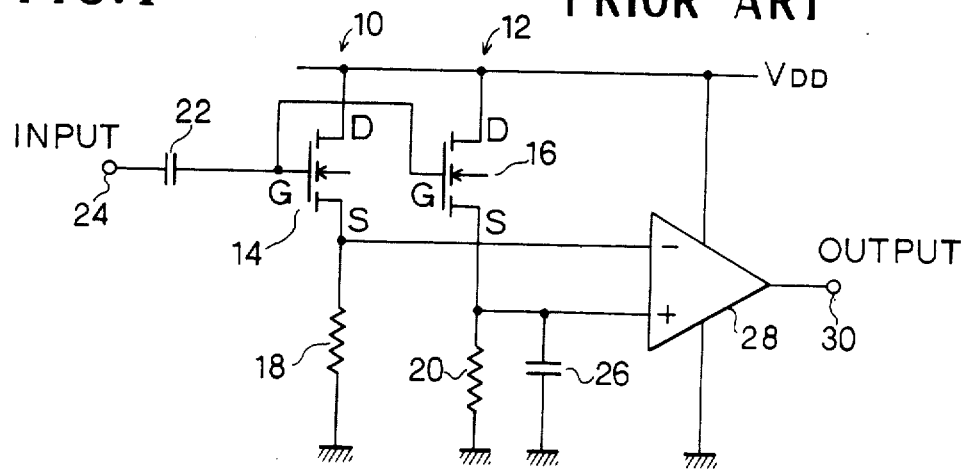
FIG. 1 is a circuit diagram showing a conventional signal detecting circuit.

Referring to FIG. 1, there is shown a circuit diagram of a typical conventional signal detecting circuit, which comprises first and second source followers 10 and 12 which respectively include insulated gate field effect transistors 14 and 16. These field effect transistors are connected at their drains to a positive supply voltage $V_{DD}$ and are also grounded at their sources through impedance elements such as resistors 18 and 20, respectively. The gates of the field effect transistors 14 and 16, which constitute respective inputs of the two source followers 10 and 12, are commonly-connected to one end of a capacitor 22 whose other end is connected to an input terminal 24 of the signal detecting circuit.

The source of the field effect transistor 16, which constitutes an output of the second source follower 12, is connected with another capacitor 26 for holding the potential. The sources of the two field effect transistors 14 and 16 are connected to an inverted input and a non-inverted input of a voltage comparator 28, whose output is connected to an output terminal 30 of the signal detecting circuit.

In the signal detecting circuit described above, the second source follower 12 and the capacitor 26 constitute a peak voltage hold circuit, and therefore, the voltage comparator 28 continuously compares the level of an input signal supplied through the first source follower 10, with the level of the peak voltage given by the peak hold circuit. Accordingly, even if noise is contained in the input signal, it is possible to detect a signal component regardless of the noise component if the signal component is larger than the noise component.

However, the above signal detecting circuit needs a capacitor 26 which has to have a substantial capacitance to hold the potential and which therefore is very difficult to provide in integrated circuit form. Accordingly, when the signal detecting circuit is constructed in the form of an integrated circuit, the capacitor 26 must be externally connected to the integrated circuit, and therefore the signal detecting integrated circuit has to have not only the signal input terminal 24 and the signal output terminal 30, but also an external terminal connected to the second source follower 12 for connection of the capacitor 26.

Furthermore, in a no-signal condition, the outputs of the first source follower and the peak hold circuit assume substantially the same potential. In this situation, noises will often erroneously be detected as signal components because the noises themselves will vary. In addition, the voltage comparator will properly operate only when the input signals applied to the comparator are within the common-mode input voltage range. However, since the voltage applied as the reference voltage to the non-inverted input of the voltage comparator 28 follows the peak level of the input signal, the amplitude of the input signal must be limited to be within the common-mode input voltage range, and so, the circuit will often malfunction when too large of a signal is applied.

Figure 2:
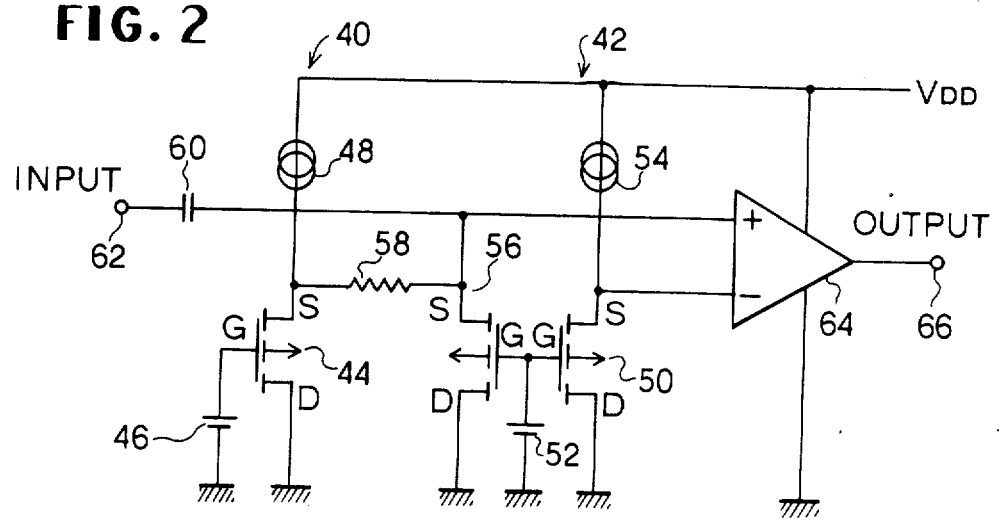
FIG. 2 is a circuit diagram showing a first embodiment of the signal detecting circuit in accordance with the present invention.

Turning to FIG. 2, there is shown a first embodiment of the signal detecting circuit in accordance with the present invention. The circuit comprises first and second source follower circuits 40 and 42. The first source follower circuit 40 includes a drain-grounded p-channel insulated gate field effect tansistor 44 having a gate connected to a first constant voltage source 46 and a source connected through a constant current source 48 to a positive supply voltage $V_{DD}$. The second source follower circuit 42 includes a drain-grounded p-channel insulated gate field effect transistor 50 having a gate connected to a second constant voltage source 52 and a source connected through another constant current source 54 to the positive supply voltage $V_{DD}$. The gate of the field gate transistor 50 is connected to a gate of a third drain-grounded p-channel insulated gate field effect transistor 56, which is in turn connected at its source through a resistor 58 to the source of the field effect transistor 44. Furthermore, the source of the field effect transistor 56 is connected through a capacitor 60 to an input terminal 62 and is also connected to a non-inverted input of a voltage comparator 64, whose inverted input is connected to the source of the field effect transistor 50. The output of the comparator 64 is connected to an output terminal 66 of the signal detecting circuit. In this embodiment, the voltage $V_{46}$ of the first voltage source 46 is smaller than the voltage $V_{52}$ of the second voltage source 52, and the resistance of the resistor 58 is sufficiently larger than the conduction resistance of the field effect transistor 56.

Assuming that the threshold voltage of the three p-channel field effect transistors is $V_{TP}$, when in a no-signal condition, the source voltage of the field effect transistor 44 is expressed by $V_{46} - V_{TP}$, and the source voltage $V_{S56}$ of the field effect transistor 56 is equal to the source voltage of the field effect transistor 44. Namely, $V_{S56} = V_{46} - V_{TP}$. On the other hand, the gate voltage $V_{G56}$ of the field effect transistor 56 is the voltage $V_{52}$, and so, the gate-source voltage $V_{GS56}$ of the field effect transistor 56 is expressed by:

$$V_{GS56} = V_{G56} - V_{S56} = V_{52} - V_{46} + V_{TP} \quad (1)$$

Here, the condition for turning on the p-channel insulated gate field effect transistor is:

$$V_{GS} - V_{TP} < 0 \quad (2)$$

As regards the field effect transistor 56, therefore, the following equation can be derived from the above formulae (1) and (2):

$$V_{GS56} - V_{TP} = V_{52} - V_{46} > 0 \quad (V_{52} > V_{46})$$

Therefore, the field effect transistor 56 is maintained off in the no-signal condition. In other words, the source-drain path of the transistor 56 is in a high resistance condition, and therefore, the non-inverted input of the voltage comparator is supplied with the source voltage $V_{S56}$ (= $V_{46} - V_{TP}$) of the transistor 56. On the other hand, the inverted input of the comparator 64 is supplied with the source voltage ($V_{52} - V_{TP}$) of the field effect transistor 50.

Therefore, the difference betwwen the two input voltages of the comparator 64 is expressed by:

$$(V_{46} - V_{TP}) - (V_{52} - V_{TP}) = V_{46} - V_{52} < 0 \quad (V_{52} > V_{46})$$

At this time, the comparator 64 outputs a low level signal.

Figure 3A:
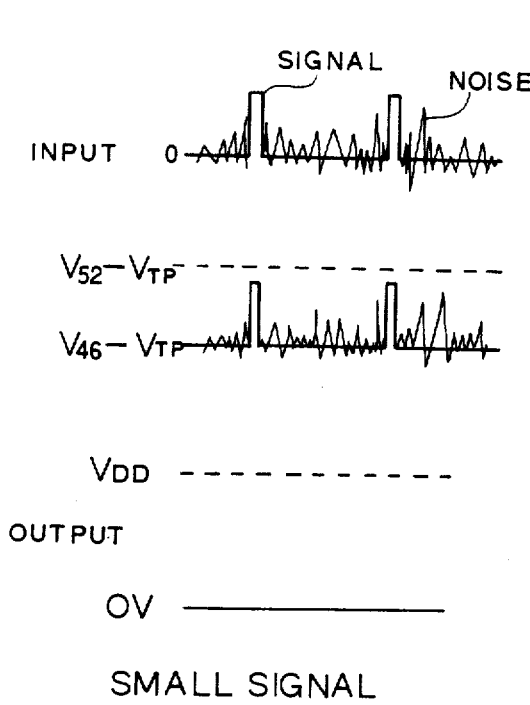
FIGS. 3A and 3B are waveform diagrams showing signals at various points in the circuit shown in FIG. 2 when a small signal and a large signal are applied, respectively.

Accordingly, when a small signal is applied to the input terminal 62 as shown in FIG. 3A, if the amplitude voltage $V_{ip}$ of the input signal (the difference between the mean level and the peak level of the input signal) is not larger than ($V_{52} - V_{46}$), the source voltage of the field effect transistor 56 will vary around the level of $V_{46} - V_{TP}$ and will not exceed the level of $V_{52} - V_{TP}$, as shown in FIG. 3A. In this case, the output of the comparator 64 is maintained at a low level such as 0V.

Thus, unless the amplitude of the signal applied to the input terminal is within the range of $V_{52} - V_{46}$, the comparator 64 will maintain its output at a low level, In a no-signal condition or in a weak signal condition, accordingly, no output signal will be generated in response to noise.

However, when the amplitude of the input signal exceeds the level of $V_{52} - V_{46}$, the comparator 64 will reverse its output to a high level. At this time, furthermore, the source voltage of the field effect transistor 56 will exceed a voltage which is higher than the gate potential of the transistor 56 by its threshold voltage $V_{TP}$, and therefore the transistor 56 is turned on. Since the gate of the transistor 56 is biased at the constant voltage of $V_{52}$, with the turning-on of the transistor 56 the source potential of the transistor 56, i.e., the non-inverted input of the comparator 64, is clamped to the level of $V_{52} - V_{TP}$. Accordingly, even if the peak level of the input signal assumes the level of $V_{52} - V_{46}$, the non-inverted input of the comparator 64 is clamped at the level of $V_{52} - V_{TP}$. Since the conduction resistance of the transistor 56 is sufficiently small as compared with the resistor 58, the capacitor 60 will be charged in accordance with the difference between the peak level of the input signal and the soruce clamp level ($V_{52} - V_{TP}$) of the transistor 56.

Figure 3B:
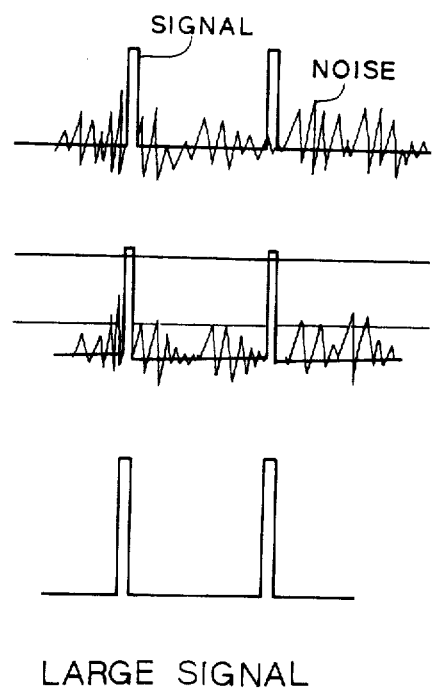

Then, if the input signal decreases in voltage, the output 66 of the comparator 64 is brought to the low level, and the transistor 56 is turned off. As a result, the source potential of the tansistor 56 will drop. But, since the capacitor 60 is charged with the above mentioned voltage difference, the source potential of the transistor 56 will further lower to a level which is lower than ($V_{46} - V_{TP}$) by the voltage across the capacitor 60. This condition is shown in FIG. 3B. Namely, the transistor 56 and the capacitor 60 cooperate to change the threshold level of the comparator 64 in response to the peak level of the input signal. In general, the larger the amplitude of the input signal, the larger the amplitude of the noise component. However, since the threshold level of the compartor 64 will elevate in accordance with the increase of the peak level of the input signal, only the signal component is detected.

As mentioned above, since the non-inverted input of the comparator 64 is clamped by the level of $V_{52} - V_{TP}$, a signal component can be detected regardless of a considerable increase in the peak level of the input signal.

Figure 4:
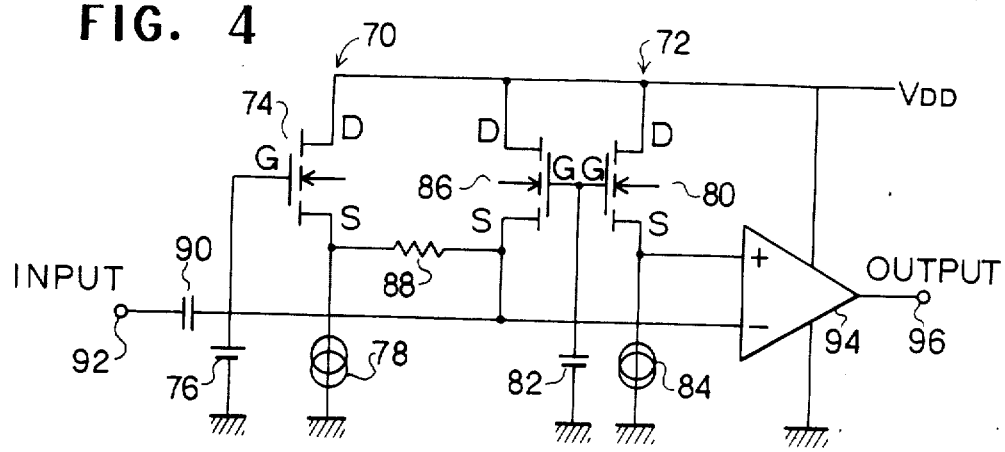
FIG. 4 is a diagram similar to FIG. 2 but showing a second embodiment of the present invention.

Referring to FIG. 4, there is shown another embodiment of the signal detecting circuit adapted to detect a negative signal. This second embodiment comprises first and second source follower circuits 70 and 72. The first source follower circuit 70 includes a n-channel insulated gate field effect transistor 74 having a gate connected to a first constant voltage source 76 and a drain connected to a positive supply voltage $V_{DD}$. The source of the field effect transistor 74 is grounded through a constant current source 78. The second source follower circuit 72 includes a second n-channel insulated gate field effect transistor 80 having a gate connected to a second constant voltage source 82 and a drain connected to the positive supply voltage $V_{DD}$. The source of the second n-channel field effect transistor 80 is grounded through another constant current source 84.

The gate of the field effect transistor 80 is connected to a gate of a third n-channel insulated gate field effect transistor 86 having a drain connected to the positive supply voltage $V_{DD}$. The third transistor 86 is connected at its source through a resistor 88 to the source of the field effect transistor 74. Furthermore, the source of the field effect transistor 86 is connected through a capacitor 90 to an input terminal 92 and also connected to an inverted input of a voltage comparator 94, whose non-inverted input is connected to the source of the field effect transistor 80. The output of the comparator 94 is connected to an output terminal 96 of the signal detecting circuit.

In this embodiment, the voltage $V_{76}$ of the first voltage source 76 is larger than the voltage $V_{82}$ of the second voltage source 82. In addition, similarly to the first embodiment, the resistance of the resistor 88 is sufficiently larger than the conduction resistance of the field effect transistor 86.

Figure 5A:
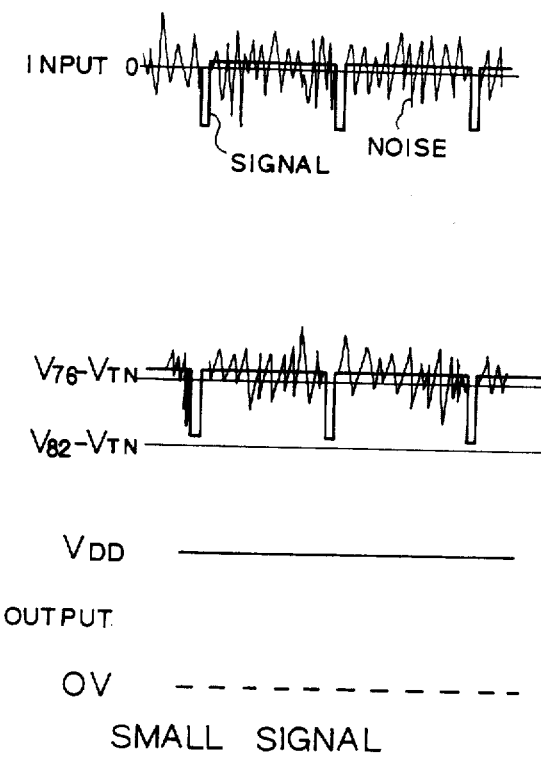
FIGS. 5A and 5b are waveform diagrams showing signals at various points in the circuit shown in FIG. 4 when a small signal and a large signal are applied, respectively.
Figure 5B:
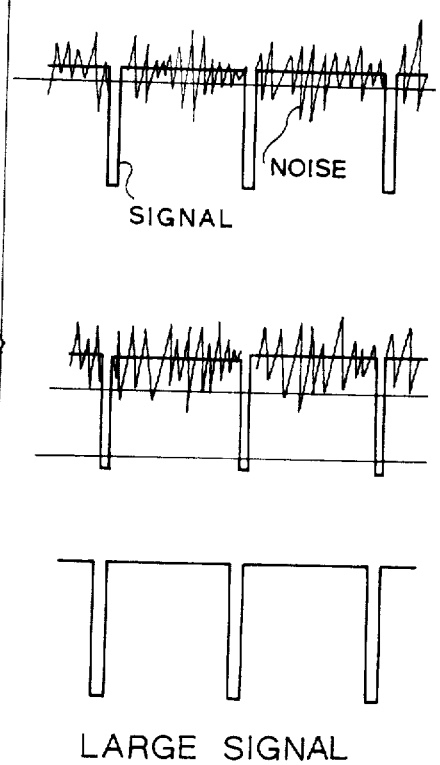

This second embodiment operates similarly to the first embodiment, except that the polarities of the signals at various points in the second embodiment circuit are in reversed relation to those of the first embodiment, as shown in FIGS. 5A and 5B which show waveforms at various points when a small signal and a large signal are applied, respectively. In these figures, $V_{76}$ and $V_{82}$ represent the voltages of the constant voltage sources 76 and 82, respectively, and $V_{TN}$ designates the threshold voltage of the three n-channel field effect transistors 74, 80 and 86.

In the above two embodiments, the voltage sources 46, 52, 76 and 82 are connected to the gates of the insulated gate field effect transistors, and therefore a current does not flow from these voltage sources. Therefore, these voltage sources can be constituted of a voltage divider consisting of a pair of series-connected insulated gate field effect transistors, each having a gate and a drain commonly connected to each other, as shown in FIGS. 6A, 6B and 6C.

Figure 6A:
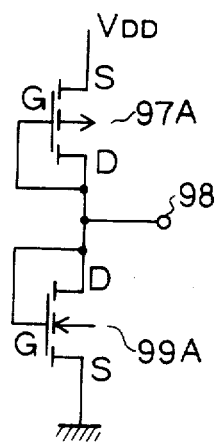
FIGS. 6A, 6B and 6C illustrate examples of the voltage sources which can be used in the circuits shown in FIGS. 2 and 4.

In the case of FIG. 6A, the voltage source includes a p-channel insulated gate field effect transistor 97A having a source connected to the positive supply voltage $V_{DD}$ and a gate and a drain commonly connected to an output terminal 98 of the voltage source, and an n-channel source-grounded insulated gate field effect transistor 99A having a gate and drain commonly connected to the output terminal 98 of the voltage source.

Figure 6B:
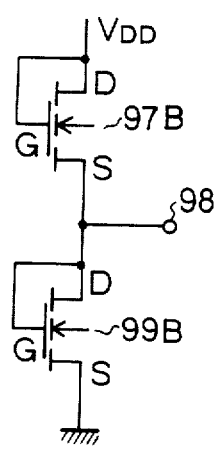
Figure 6C:
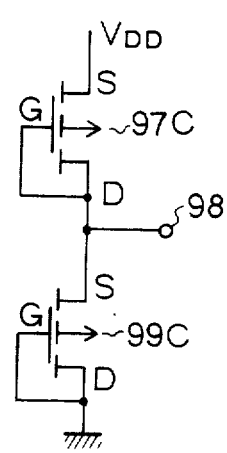

In the case of FIG. 6B, each voltage source includes an n-channel insulated gate field effect transistor 97B having a gateand a drain commonly connected to the positive supply voltage $V_{DD}$ and a source connected to an output terminal 98 of the voltage source, and another n-channel source-grounded insulated gate field effect transistor 99B having a gate and drain commonly connected to the output terminal 98 of the voltage source.

Furthermore, the voltage source includes a p-channel insulated gate field effect transistor 97C having a source connected to the positive supply voltage $V_{DD}$ and a gate and a drain commonly connected to an output terminal 98 of the voltage source, and another p-channel insulated gate field effect transistor 99C having a source connected to the output terminal 98 of the voltage source and a gate and a drain commonly grounded.

In addition, in the above embodiments, if the two inputs to the comparators are reversed so that the signals which have been respectively supplied to the non-inverted and inverted inputs of the comparator are applied to the inverted and non-inverted inputs of the comparator, respectively, a reversed pulse signal can be obtained from the comparator.

As seen from the above, since the signal detecting circuit of the present invention needs no potential holding capacitor which has to be provided externally to the circuit when it is provided in integrated circuit form, it is sufficient if only one signal input terminal and one signal output terminal are provided. Therefore, when the signal detecting circuit is realized in the form of an integrated circuit, the number of external terminals can be decreased.

In addition, the signal detecting circuit of the present invention does not respond to an input not exceeding a predetermined level, and therefore the circuit will not detect undesired components such as noises.

Furthermore, the reference voltage of the comparator is given by the output voltage of the second source follower, i.e., the source voltage of the second insulated gate field effect transistor. This output voltage of the second source follower is at a constant regardless of the amplitude of the input signal, as explained hereinbefore. Therefore, there can be used a voltage comparator having a narrow common-mode input voltage range. Additionally, even if the amplitude of the input signal exceeds the power supply voltage, the circuit will operate stably.

The invention has thus been shown and described with reference to specific embodiments. However, it should be noted that the invention is in no way limited to the details of the illustrated structures, but that changes and modifications may be made within the scope of the appended claims.

What is claimed is:

1. A signal detecting circuit comprising a first source follower having an input connected to a first voltage source, a second source follower having an input connected to a second voltage source, first transistor means having a gate connected to the input of the second source follower and a source connected through a resistor to an output of the first source follower, a signal input terminal connected to the source of said first transistor means, and a voltage comparator having two inputs, one of which is connected to the source of said first transistor means and the other of which is connected to an output of the second source follower.

2. A signal detecting circuit as claimed in claim 1 wherein the signal input terminal is connected through a capacitor to the source of said first transistor means.

3. A signal detecting circuit as claimed in claim 1 wherein the first source follower includes a first drain-grounded p-channel insulated gate field effect transistor having a gate connected to the first voltage source and a source connected to the resistor and also connected through a constant current source to a positive supply voltage, and wherein the second source follower includes a second drain-grounded p-channel insulated gate field effect transistor having a gate connected to the second voltage source and a source connected to the other input of the voltage comparator and also connected through another constant current source to the positive supply voltage, and wherein said first transistor means comprises a third p-channel insulated gate field effect transistor having a gate connected to the gate of the second p-channel field effect transistor and a drain connected to ground.

4. A signal detecting circuit as claimed in claim 3 wherein the voltage of the first voltage source is smaller than that of the second voltage source, and the resistance of the resistor is sufficiently larger than the conduction resistance of said first transistor means.

5. A signal detecting circuit as claimed in claim 3 wherein each of the first and second voltage sources includes a pair of series-connected insulated gate field effect transistors, each having a gate and a drain commonly connected to each other.

6. A signal detecting circuit as claimed in claim 3 wherein each of the first and second voltage sources includes a p-channel insulated gate field effect transistor having a source connected to the positive supply voltage and a gate and a drain commonly connected to an output terminal of the voltage source, and an n-channel source-grounded insulated gate field effect transistor having a gate and drain commonly connected to the output terminal of the voltage source.

7. A signal detecting circuit as claimed in claim 3 wherein each of the first and second voltage sources includes an n-channel insulated gate field effect transistor having a gate and a drain commonly connected to the positive supply voltage and a source connected to an output terminal of the voltage source, and another n-channel source-grounded insulated gate field effect transistor having a gate and drain commonly connected to the output terminal of the voltage source.

8. A signal detecting circuit as claimed in claim 3 wherein each of the first and second voltage sources includes a p-channel insulated gate field effect transistor having a source connected to the positive supply voltage and a gate and a drain commonly connected to an output terminal of the voltage source, and another p-chaannel insulated gate field effect transistor having a source connected to the output terminal of the voltage source and a gate and a drain commonly grounded.

9. A signal detecting circuit as claimed in claim 1 wherein the first source follower includes a first n-channel insulated gate field effect transistor having a gate connected to the first voltage source and a drain connected to a positive supply voltage, the source of the first field effect transistor being connected to the resistor and also grounded through a constant current source, wherein the second source follower includes a second n-channel insulated gate field effect transistor having a gate connected to the second voltage source and a drain connected to the positive supply voltage, the source of the second n-channel field effect transistor being connected to the other input of the voltage comparator and also grounded through another constant current source, and wherein said first transistor means comprises a third n-channel insulated gate field effect transistor having a gate connected to the gate of said second n-channel field effect transistor and a drain connected to the positive supply voltage.

10. A signal detecting circuit as claimed in claim 9 wherein the voltage of the first voltage source is larger than that of the second voltage source, and the resistance of the resistor is sufficiently larger than the conduction resistance of said first transistor means.

11. A signal detecting circuit as claimed in claim 9 wherein each of the first and second voltage sources includes a pair of series-connected insulated gate field effect transistors, each having a gate and a drain commonly connected to each other.

12. A signal detecting circuit as claimed in claim 9 wherein each of the first and second voltage sources includes a p-channel insulated gate field effect transistor having a source connected to the positive supply voltage and a gate and a drain commonly connected to an output terminal of the voltage source, and an n-channel source-grounded insulated gate field effect transistor having a gate and drain commonly connected to the output terminal of the voltage source.

13. A signal detecting circuit as claimed in claim 9 wherein each of the first and second voltage sources includes an n-channel insulated gate field effect transistor having a gate and a drain commonly connected to the positive supply voltage and a source connected to an output terminal of the voltage source, and another n-channel source-grounded insulated gate field effect transistor having a gate and drain commonly connected to the output terminal of the voltage source.

14. A signal detecting circuit as claimed in claim 9 wherein each of the first and second voltage sources includes a p-channel insulated gate field effect transistor having a source connected to the positive supply voltage and a gate and a drain commonly connected to an output terminal of the voltage source, and another p-channel insulated gate field effect transistor having a source connected to the output terminal of the voltage source and a gate and a drain commonly grounded.

15. A signal detecting circuit comprising a first insulated gate field effect transistor having a gate connected to a first voltage source, a second insulated gate field effect transistor having a gate connected to a second voltage source, a third insulated gate field effect transistor having a gate connected to the gate of the second field effect transistor and a source which is connected through a resistor to a source of the first field effect transistor, a signal input terminal connected to the source of the third field effect transistor, and a voltage comparator having two inputs, one of which is connected to the source of the third field effect transistor and the other of which is connected to an output of the second field effect transistor.

16. A signal detecting circuit as claimed in claim 15 wherein the signal input terminal is connected through a capacitor to the source of said third field effect transistor.

17. A signal detecting circuit as claimed in claim 16 wherein the first field effect transistor is of a p-channel type having a grounded drain and a source connected to the resistor and also connected through a constant current source to a positive supply voltage, wherein the second field effect transistor is also of a p-channel type having a grounded drain and a source connected to the other input of the voltage comparator and also connected through another constant current source to the positive supply voltage, and wherein the third field effect transistor is of a p-channel type having a drain connected to ground.

18. A signal detecting circuit as claimed in claim 17 wherein the voltage of the first voltage source is smaller than that of the second voltage source, and the resistance of the resistor is sufficiently larger than the conduction resistance of the third field effect transistor.

19. A signal detecting circuit as claimed in claim 16 wherein the first field effect transistor is of an n-channel type having a drain connected to a positive supply voltage, and a source connected to the resistor and also grounded through a constant current source, wherein the second field effect transistor is also of an n-channel type having a drain connected to the positive supply voltage and a source connected to the other input of the voltage comparator and also grounded through another constant current source, and wherein the third field effect transistor is of an n-channel type having a drain connected to the positive supply voltage.

20. A signal detecting circuit as claimed in claim 19 wherein the voltage of the first voltage source is larger than that of the second voltage source, and the resistance of the resistor is sufficiently larger than the conduction resistance of said third field effect transistor.

* * * * *

UNITED STATES PATENT AND TRADEMARK OFFICE
CERTIFICATE OF CORRECTION

PATENT NO. : 4,672,238
DATED : June 9, 1987
INVENTOR(S) : Masahisa Nemoto

It is certified that error appears in the above-identified patent and that said Letters Patent is hereby corrected as shown below:

Column 1, line 22, delete "is" insert --must be--
Column 1, line 23, delete "so" insert --thus--
Column 2, line 66, delete "grouned" insert --grounded--
Column 3, line  6, delete "grouned" insert --grounded--
Column 5, line 30, delete "betwwen" insert --between--
Column 5, line 19, between "$V_{46} > 0$" and "$(V_{52} > V_{46})$" insert --thus--
Column 5, line 34, between "$V_{52} < 0$" and $(V_{52} > V_{46})$" insert --thus--
Column 5, line 48, after "level" delete " , " insert -- . --
Column 6, line  2, delete "soruce" insert --source--
Column 7, line 25, delete "gateand" insert --gate and--
Column 9, line  9, delete "chaannel" insert --channel--

Signed and Sealed this

Twenty-first Day of June, 1988

Attest:

DONALD J. QUIGG

*Attesting Officer*   *Commissioner of Patents and Trademarks*